United States Patent [19]

Gorfinkel et al.

[11] Patent Number: 5,311,526
[45] Date of Patent: May 10, 1994

[54] ARTICLE THAT COMPRISES A SEMICONDUCTOR LASER, AND METHOD OF OPERATING THE ARTICLE

[75] Inventors: Vera B. Gorfinkel, Baunatal-Altenritte, Fed. Rep. of Germany; Serge Luryi, Bridgewater, N.J.

[73] Assignee: AT&T Bell Laboratories, Murray Hill, N.J.

[21] Appl. No.: 22,249

[22] Filed: Feb. 25, 1993

[51] Int. Cl.⁵ .............................................. H01S 3/10
[52] U.S. Cl. ........................................ 372/26; 372/31
[58] Field of Search .................................. 372/26, 31

[56] References Cited

U.S. PATENT DOCUMENTS

| | | | |
|---|---|---|---|
| 4,750,833 | 6/1988 | Jones | 356/73.1 |
| 5,023,878 | 6/1991 | Berthold et al. | 372/20 |
| 5,172,382 | 12/1992 | Loh et al. | 372/26 |
| 5,182,756 | 1/1993 | Waki et al. | 372/26 |

OTHER PUBLICATIONS

"High Frequency Modulation of Light Output Power in Double-Heterojunction Laser", by V. B. Gorfinkel et al., *International Journal of Infrared and Millimeter Waves,* vol. 12, No. 6, (1991), pp. 649-658 (no month).
"Rapid modulation of interband optical properties of quantum wells by intersubband absorption", by Vera B. Gorfinkel et al., *Applied Physics Letters,* vol. 60(25), Jun. 1992, pp. 3141-3143.
G. P. Agrawal et al., "Long-Wavelength Semiconductor Lasers", Van Nostrand Reinhold, New York, 1986 (no month).
I. P. Kaminow, "Introduction to Electro-Optic Devices", Academic Press, Orlando, 1974 (no month).
"InGaAs/InP multiple quantum well tunable Braff reflector", by O. Blum et al., *Applied Physics Letters,* vol. 59 (23), Dec. 2, 1991, pp. 2971-2973.

*Primary Examiner*—James W. Davie
*Attorney, Agent, or Firm*—Eugen E. Pacher

[57] ABSTRACT

We have discovered that coherent variation of at least two laser parameters can result in improved device performance, e.g., in pure amplitude or frequency modulation at frequencies substantially above 1 GHz, or in previously unattainable modulation frequencies. Among the relevant laser parameters are pumping rate, optical gain coefficient, photon lifetime, confinement factor, effective carrier temperature, output frequency and spontaneous emission factor. Exemplarily, the pumping rate and the optical gain are coherently varied such that the output radiation is free of chirp, or the output frequency and the effective carrier temperature are coherently varied such that the output radiation has constant amplitude.

14 Claims, 2 Drawing Sheets

ARTICLE THAT COMPRISES A SEMICONDUCTOR LASER, AND METHOD OF OPERATING THE ARTICLE

FIELD OF THE INVENTION

This application pertains to an article (e.g., a communication or data processing system) that comprises a semiconductor laser and to a method of operating the article that comprises high frequency modulation of the laser output.

BACKGROUND OF THE INVENTION

Semiconductor lasers are well known. High-frequency modulation of the output radiation of semiconductor laser is an active area of optoelectronics. At present, amplitude modulation (AM) is the most widely used scheme. The conventional method of modulating the output amplitude of a semiconductor laser involves varying the laser pumping rate, by varying either electrical pump current or pump photon flux. This method is simple but is known to be limited to relatively low frequencies, typically $\lesssim 10$ GHz. Furthermore, the modulation frequencies $\gtrsim 1$ GHz, the conventional modulation method is plagued by oscillations in the wavelength of the dominant mode of the output radiation. This phenomenon is generally referred to as "chirp". Both of the above referred to shortcomings of the conventional modulation method are due to an intrinsic resonance in the nonlinear laser system, the electron-photon resonance.

An alternative method for modulating the laser output is to directly control by external means the gain coefficient associated with the laser cavity. See, for instance, U.S. Pat. No. 5,023,878, which discloses a semiconductor laser which comprises, in addition to a "gain" section, a "loss" section that is optically coupled to the gain section but is electrically substantially isolated therefrom, such that the modal gain of the laser cavity can be changed through change of the electrical bias on the loss section.

Recently, a different and novel method of varying the gain coefficient associated with the active medium was disclosed. The method involves varying the effective carrier temperature $T_e$ in the laser active region. V. B. Gorfinkel et al., *International Journal of Millimeter and Infrared Waves*, Vol. 12, p. 649 (1991) disclose heating the electrons in the active region by driving an electric current through the active region, and V. B. Gorfinkel et al., *Applied Physics Letters*, Vol. 60, p. 3141 (1992) (incorporated hereby by reference) disclose heating by inducing intersubband absorption in quantum wells in the active region. See also U.S. patent application Ser. No. 07/814,745, filed Dec. 24, 1992 for V. B. Gorfinkel et al. (also incorporated by reference), which inter alia discloses an optical modulator that utilizes carrier heating by means of intersubband absorption. High frequency modulation of $T_e$ by several tens of degrees has been demonstrated experimentally.

Although the method of varying $T_e$ in principle allows faster laser modulation than the conventional (pump current modulation) method, it neither eliminates the relaxation oscillations nor the frequency chirp.

Although at present most laser modulation is AM, there is a growing demand for frequency-modulated (FM) laser output. Coherent optical communication methods based on FM signals are advantageous because varying the optical frequency within the laser amplification bandwidth (approximately 10 nm) opens a larger number of communication channels that are available with AM methods. Existing FM techniques are typically based on the modulation of the optical cavity length of a single-mode laser and can be classified in two groups: those which use the electro-optic effect for the modulation and those that modulate the carrier concentration in specially designed cavity sections. In both schemes, it is the real part of the refractive index which is modulated by the external control means, leading to a variation of the optical path length.

The electro-optic effect typically is very fast. However, as usually implemented in the prior art, electro-optic FM is necessarily accompanied by oscillation in the carrier concentration in the laser, which limits the possible rate of modulation and typically results in output that exhibits amplitude as well as frequency modulation (AFM).

FM schemes that modulate the carrier concentration also exhibit drawbacks. If the carrier modulation occurs in a region of the laser wherein the semiconductor material has a larger bandgap than the material in the active region of the laser then the modulation speed typically is limited by a relatively slow (of order 1 ns) spontaneous recombination. If, on the other hand, the bandgap is the same in the two regions then the recombination can be faster, helped by the stimulated emission process, but the optical output of the laser typically will exhibit AFM.

To summarize, conventional methods of laser modulation, whether they are nominally AM or FM, at high modulation rates (above about 1 GHz) typically result in an unwelcome mixture of the amplitude and frequency modulation. Moreover, the most widely used conventional laser modulation methods, based on the modulation of laser pump rate, are limited to relatively low frequencies ($\lesssim 10$ GHz).

It would be highly desirable to have available a method of modulating a semiconductor laser that can make possible higher modulation rates than are attainable with the conventional (pump current modulation) methods, and/or that makes possible substantially pure amplitude-modulated (AM) or pure frequency-modulated (FM) laser output at modulation frequencies higher than the currently attainable maximum frequency of about 1 GHz. This application discloses such a method, as well as apparatus for the practice of the method.

Higher modulation frequencies, and/or substantially pure AM or FM laser output modulation at rates in excess of the currently attainable maximum rate of about 1 GHz, would be of interest in many areas of technology, exemplarily in optical fiber communications and in optical data processing. We anticipate that the below disclosed method and apparatus can be advantageously used in these and other areas of technology.

SUMMARY OF THE INVENTION

Broadly speaking, the invention is embodied in a novel method of modulating a semiconductor laser, as well as in apparatus that comprises a semiconductor laser and novel means for modulating the laser output.

We have discovered that coherently varying, e.g., both the laser pumping rate and the optical gain in the active region of the laser can eliminate the relaxation oscillations and makes possible modulation at frequencies in excess of 10 GHz, e.g., up to about 50 GHz. It also can suppress chirp, making possible emission of substantially chirp-free pulses at repetition rates in excess of 1 GHz, e.g., up to about 10 GHz. Exemplarily, the optical gain is varied by modulating the effective carrier temperature $T_e$ in the laser active region.

As will be described in detail below, coherently varying the pumping rate and the optical gain is a particular example of a more general procedure which involves coherently varying at least two parameters out of a set of relevant laser parameters. Among the relevant parameters are, in addition to pump rate and optical gain, the photon lifetime $\tau_{ph}$, the confinement factor $\Gamma$, and the spontaneous emission factor $\beta$. The meaning of "coherently varying" two laser parameters will be defined below.

A particular embodiment of the invention is a method of operating an article (e.g., an optical fiber communication system) that comprises a semiconductor laser and means for utilizing the radiation output of the laser. Associated with the laser at least during laser operation are a pumping rate J, an optical gain g, a photon lifetime $\tau_{ph}$, a confinement factor $\Gamma$, a spontaneous emission factor $\beta$, a carrier density n, an effective carrier temperature $T_e$, an output power P and an output frequency $\Omega$. The method comprises pumping the laser so that the laser operates in the lasing regime. Significantly, the method further comprises varying coherently at least two of J, g, $\tau_{ph}$, $\Gamma$, $T_e$, $\Omega$ and $\beta$. It should be noted that the pumping rate J, having dimensions (length)$^{31}$ $^3\times$ (time)$^{-1}$, is the rate of electron/hole pair generation, and is proportional to pump current or pump radiation intensity, as the case may be.

Another particular embodiment of the invention is an article (e.g., optical data processing apparatus) that comprises a semiconductor laser and means for utilizing the radiation output of the laser. Associated with the laser at least during laser operation are said parameters J, g, $\tau_{ph}$, $\Gamma$, $\beta$, n, $T_e$, P and $\Omega$. The article comprises means for pumping the laser, such that the laser is in the lasing regime. Significantly, the particle still further comprises means for varying coherently at least two of J, g, $\tau_{ph}$, $\Gamma$, $\Omega$ and $\beta$. In some currently preferred embodiments of the invention the pumping rate J is varied coherently with one of g, $\tau_{ph}$ and $\Gamma$. In another currently preferred embodiment g and $\Omega$ are varied coherently.

Herein, one parameter $X_1(t)$ (e.g., the optical gain) is varied "coherently" with another parameter $X_2(t)$ (e.g., the pumping rate) if, for harmonic modulation, the two parameters are varied at one and the same frequency, with a predetermined phase and amplitude relationship between the variations. For non-harmonic (e.g., pulsed or arbitrary analog modulation), "coherent" modulation required a definite, determinable relationship between $X_1(t)$ and $X_2(t)$, e.g., between the pulse shapes, amplitudes and phases.

DETAILED DESCRIPTION OF SOME EXEMPLARY EMBODIMENTS

Figure 1:
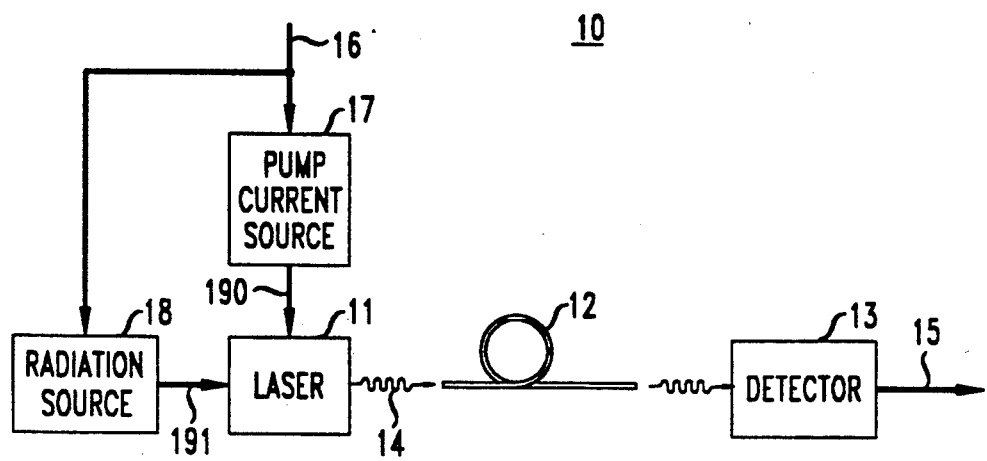
FIG. 1 schematically depicts an exemplary article according to the invention, namely, an optical fiber communication system.

A semiconductor laser can be described by standard rate equations, as follows:

$$dn/dt = J - Sg - Bn^2; \tag{1a}$$

$$dS/dt = (\Gamma g - \tau_{ph}^{-1})S + \beta Bn^2. \tag{1b}$$

For background and greater detail see, for instance, G. P. Agrawal et al. "Long Wavelength Semiconductor Lasers"; Van Nostrand Reinhold, New York, 1986.

In these equations, n is the carrier density, S is the photon density, J is the pumping rate, $B(\sim 10^{-10} cm^3/s)$ is the radiative electron/hole recombination coefficient, $\beta$ is the spontaneous emission factor, $g = g_0 c$, where $g_0$ is the optical gain in the active region and c is the speed of light in the medium, $\Gamma$ is the confinement factor for the radiation intensity, $\tau_{ph}$ is the photon lifetime in the laser cavity, and t is time. The output power P(t) is to a good approximation proportional to S(t).

In the lasing regime, the steady state value of $J = \bar{J}$ is greater than a threshold value $J_{th} = B\bar{n}^2$, where the bar signifies the steady state value of the given parameter. In the steady state one has approximately [neglecting the typically small $(\beta \sim 10^{-4})$ term $\beta Bn^2$], $$\bar{g}\bar{S} = \bar{J} - J_{th}; \text{ and } \Gamma \bar{g} \tau_{ph} = 1$$

Equations 1) can be solved by conventional small signal analysis, utilizing the notation that any time-varying quantity X(t) can be expressed as $\bar{X} + \hat{X}e^{i\omega t}$, where $\bar{X}$ is the steady state value, $\hat{X}$ is the (typically complex) amplitude of the variation, and $\omega$ is the angular frequency.

We will now consider a particular embodiment of the invention, namely, laser operation with both J and g varied harmonically, and all other relevant parameters (e.g., $\Gamma$, $\tau_{ph}$, $\beta$) maintained constant. Specifically, we will consider variation of g by varying the effective carrier temperature $T_e$ in the active region.

With these assumptions, equations (1) can be linearized about a steady state value above the lasing threshold, to yield $$i\omega\hat{n} = \hat{J} - \bar{S}\hat{g} - \bar{g}\hat{S} - 2B\bar{n}\hat{n}; \tag{2a}$$

$$i\omega\hat{S} = (\Gamma\bar{g} - \tau_{ph}^{-1})\hat{S} + \Gamma\bar{S}\hat{g} + 2\beta B\bar{n}\hat{n}. \tag{2b}$$

The small signal variation of the gain can be described by two coefficients $g'_n$ and $g'_T$, each of which depends on the steady state values of carrier concentration $\bar{n}$ and temperature $\bar{T}_e$, as well as the optical angular frequency $\Omega$, as follows:

$$\hat{g} = g'_n(\bar{n}, \bar{T}_e, \Omega)\hat{n} + g'_T(\bar{n}, \bar{T}_e, \Omega)\hat{T}_e. \tag{3}$$

The goal of this analysis is to find solutions of equations (2a) and (2b) for which the quantities $\hat{n}$ and $\hat{T}_e$ have a definite "target" relationship, that is to say, for which $$\hat{n} = \gamma \hat{T}_e, \tag{4}$$

where $\gamma$ is a, possibly complex, coefficient.

Those skilled in the art will be able to verify that the following is a solution of equations (2a) and (2b), subject to condition (4):

$$\hat{S} = (\hat{J}/g)[1 - \omega^2 \tau_{ph}\tau + i\omega\tau_{ph}(1 + \tau/\tau_{sp})]^{-1}, \quad (5)$$

where $\tau = \gamma[(g'_T + \gamma g'_n)\bar{S}]^{-1}$, and $\tau_{sp} = (2B\bar{n})^{-1}$. Equation (5) is the laser response function. It contains the usual pole, corresponding to the electron-photon resonance, and shows that the laser signal power $\hat{P}$ (which is proportional to $\hat{S}$) decreases to $\omega^{-2}$ at high enough frequencies.

This substantially completes the analysis of the first exemplary embodiment, which was provided for pedagogical reasons, and which is not intended as a limitation on the scope of the invention. In particular, it must be understood that the invention is not restricted to harmonic modulation and/or small signal modulation, but applies to laser operation in pulse mode as well as large signal analog operations.

As those skilled in the art will recognize, equation (4) requires that the variations in pumping rate and $T_e$ have predetermined amplitude and phase relationship, i.e., be "coherent". The details of these coherent variations will in general depend on the objective to be achieved, as will be illustrated below.

If the desired result is the increase of the modulation frequency range then the target relation equation (4) should be chosen so as to eliminate the relaxation oscillations in the laser. This corresponds to the requirement that $\gamma = 0 = \hat{n}$. In this case, equation (5) reduces to $$\hat{S} = \hat{J}[\bar{g}(1 + i\omega\tau_{ph})]^{-1}; \quad (5')$$

This solution requires that the variations $J$ and $T_e$ be related to each other in the following definite way:

$$\hat{T}_e = (\hat{J}/\bar{S}g'_T)[i\omega\tau_{ph}/(1 + i\omega\tau_{ph})]. \quad (6)$$

When equation (6) is fulfilled, then there is no variation of $n$ in the system, and the modulation efficiency decays with frequency as $\omega^{-1}$, in accordance with equation (5'). Thus, in a particular embodiment of the invention, $T_e$ is varied coherently with the pumping rate such that $\hat{n} = 0$. Exemplarily this is accomplished by varying $T_e$ and pump current in accordance with equation (6).

We will next evaluate equation (6) for an exemplary laser that comprises InGaAs quantum wells, substantially as described in our article in *Applied Physics Letters*, Vol. 60(25), p. 3141.

In the exemplary laser, the change with temperature of the gain coefficient $g_o$ near $T_e = 300$K is $\partial g_o/\partial T_e \approx -1.6$ cm$^{-1}$/K, yielding $g'_T \approx -1.6$ s$^{-1}$K$^{-1}$ (c, the speed of light in the medium, is approximately $10^{10}$ cm/s).

As mentioned above, the steady state solution of equations (1) corresponds to $g\bar{S} = \bar{J} - J_{th}$ and $\Gamma\bar{g} = 1/\tau_{ph}$. Substituting these expressions in equation (6) yields $$\hat{T}_e = [\hat{J}(\bar{J} - J_{th})^{-1}][\Gamma\tau_{ph}g'_T]^{-1}[i\omega\tau_{ph}(1 + i\omega\tau_{ph})^{-1}],$$
or
$$\hat{T}_e \approx [30K][-i\omega\tau_{ph}(1 + i\omega\tau_{ph})^{-1}],$$

assuming the following exemplary values: $\Gamma = 0.05$, $\tau_{ph} = 4$ps, and $\hat{J} = 0.1(\bar{J} - J_{th})$. Thus, for a sinusoidal variation of the pumping rate (e.g., of the pump current) of angular frequency $\omega$ and the assumed amplitude, the corresponding coherent variation in $T_e$ must have an amplitude of approximately $(30K) \times (\omega\tau_{ph})(1 + \omega^2\tau^2_{ph})^{-\frac{1}{2}}$ and a phase $\phi = (\pi/2) + \arctan(\omega\tau_{ph})$.

For the above exemplary case, and for frequencies much lower than about 40 GHz, $\omega\tau_{ph}$ is much less than 1, the required coherent variation of $T_e$ is very small, going to zero as $\omega$. On the other hand, for frequencies high enough such that $\omega\tau_{ph}$ is much greater than 1, the amplitude of the required coherent variation of $T_e$ settles at 30K, and the required phase shift $\phi$ becomes $\pi$, i.e., the two variations must have opposite sign.

The above exemplary evaluation of a particular coherent variation of two laser parameters was provided for tutorial purposes only, and is not intended to imply any limitation on the scope of the invention.

Those skilled in the art will appreciate that the above analysis can be readily extended to the generation of an arbitrary analog optical signal, and also to the generation of an optical pulse of arbitrary shape. We will now briefly describe an exemplary technique that can be used to determine the coherent variations in the pumping rate and $T_e$ that will yield a desired radiation pulse $S(t)$, under the previously assumed constraint that carrier density $n$ is to be constant (i.e., no electron-photon resonance).

As a first step, Fourier transform $S(t)$ into $\hat{S}(\omega)$. Next, using equation (5'), determine $\hat{J}(\omega)$ from $\hat{S}(\omega)$, and inverse Fourier transform $\hat{J}(\omega)$ to yield $J(t)$. In order to determine $T_e(t)$, use equation (6) to determine $\hat{T}_e(\omega)$ from $\hat{J}(\omega)$, and inverse Fourier transform $\hat{T}_e(\omega)$ to yield $T_e(t)$. This completes the process of determining $J(t)$ and $T_e(t)$ to result in a radiation pulse $S(t)$, with $n$ = constant.

As those skilled in the art know, it is a simple and routine matter to compute Fourier transforms and inverse Fourier transforms, either on a general purpose computer or on a dedicated computer. The procedures are well known to those skilled in the art. If the form of $S(t)$ is not known in advance, or in the case of an analog system, then the procedure has to be carried out in real time. However, in many cases (e.g., an optical communication system) $S(t)$ is predetermined. In these cases, $J(t)$ and $T_e(t)$ can be determined once and for all, and the means for providing the required coherent $J(t)$ and $T_e(t)$ can be incorporated into the system.

Suppression of the electron-photon resonance by means of coherent variation in pumping rate and optical gain is not the only desirable result that can be achieved. Another possible result is essentially complete elimination of chirp, as will now be shown.

As is well known, frequency chirp originates from relaxation oscillation, which lead to variations $\delta\eta$ in the real part $\eta$ of the refractive index in the active region.

The small-signal change of $\eta$, designated $\hat{\eta}$, can be written as follows:

$$\hat{\eta} = \hat{\eta}_{fc} + \hat{\eta}_n + \hat{\eta}_T$$

In the expression $\hat{\eta}_{fc}$ is the index change arising from free carrier absorption and is of form $\hat{\eta}_{fc} = -A\hat{n}$, where exemplarily $A \approx 10^{-20}$ cm$^3$ for InGaAs. Furthermore, $\eta_n$ and $\hat{\eta}_T$ are due to variations in interband optical gain, and are determined by evaluation of the following Kramers-Kronig relations:

$$\hat{\eta}_n = (-\bar{\eta}/\pi)P\int_0^\infty g'_n\hat{n}(\Omega'^2 - \Omega^2)^{-1}d\Omega'$$

and

-continued $$\hat{\eta}_T = (-\overline{\eta}/\pi)P \int_0^\infty g'_T \hat{T}_e (\Omega'^2 - \Omega^2)^{-1} d\Omega',$$

where P denotes the principal value of the integral. For definitions of $g'_n$ and $g'_T$, see equation (3) above.

It can be shown that it is possible to completely suppress refractive index oscillations (i.e., $\hat{\eta}=0$) if $\hat{T}_e$ and $\hat{J}$ are chosen such that $$\gamma = \left[ \overline{\eta} P \int_0^\infty g'_T (\Omega'^2 - \Omega^2)^{-1} d\Omega' \right] \left[ \pi A - \overline{\eta} P \int_0^\infty g'_n (\Omega'^2 - \Omega^2)^{-1} d\Omega' \right]^{-1}.$$

This expression can be evaluated by known methods, as those skilled in the art will appreciate. It may bear emphasizing that suppression of the electron-photon resonance ($\hat{\eta}=0$) results in significant chirp reduction, in addition to extension of the modulation range to higher frequency. On the other hand, the condition $\hat{\eta}=0$ (or, more generally, the lasing frequency $\Omega$ = constant) typically does not result in complete suppression of the electron-photon resonance, with consequent decay of the modulation efficiency as $\omega^{-2}$ for sufficiently high frequencies.

As indicated above, pumping rate and optical gain are not the only laser parameters whose coherent variation can produce advantageous results. Exemplarily, coherent variation of pumping rate and confinement factor $\Gamma$ can also produce such results, as will not be demonstrated.

Assuming that $J = J(t)$ and $\Gamma = \Gamma(t)$ are the only time-dependent externally varied parameters, a procedure substantially as used to derive equations (2a) and (2b) can be used to derive $$i\omega\hat{n} = \hat{J} - \overline{S}g'_n n - \overline{g}\hat{S} - \hat{n}/\tau_{sp}; \quad (7a)$$

$$i\omega\hat{S} = \overline{S}(\overline{\Gamma}g'_n n + \hat{\Gamma}\overline{g}). \quad (7b)$$

Requiring, as above, $\hat{n} = 0$, results in the following coherence relation between $\hat{\Gamma}$ and $\hat{J}$:

$$\hat{\Gamma} = i\omega\hat{J}/\overline{S}\overline{g}^2. \quad (8)$$

It follows that, as long as equation (8) is satisfied, the modulation efficiency will have no frequency roll-off, with $\overline{S} = \overline{J}/\overline{g}$ as in the static case. Of course, maintenance of equation (8) becomes more difficult as frequency increases, since higher and higher amplitude $\hat{\Gamma}$ is needed, substantially according to $$\hat{\Gamma}/\overline{\Gamma} = i\omega\tau_{ph}\hat{J}(\overline{J} - J_{th})^{-1} \quad (9)$$

Equation (9) shows that suppression of the electron-photon resonance by means of coherent variation of pumping rate and containment factor typically requires that $\Gamma(t)$ and $J(t)$ are about 90° out of phase.

Coherent modulation of J and $\Gamma$ according to the invention is also not restricted to small harmonic variations, and can also encompass pulse modulation and arbitrary analog variation. The required coherent variations can be determined substantially as described above for the case of variations in J and g.

As stated above, the invention encompasses coherent variation of at least two of the relevant parameters, with the relevant parameters including J, g, $\Gamma$, $\tau_{ph}$, $T_e$, $\Omega$ and $\beta$. Those skilled in the art will be able to extend the above analysis to any desired combination of externally variable parameters, e.g., to J(t) and $\tau_{ph}(t)$, and detailed exposition of these cases appears unnecessary.

Variation of the pumping rate by means of variation of the pump current (or pump radiation intensity) in any desired manner is conventional and needs no discussion. Variation of the optical gain through variation of $T_e$ is known. See, for instance, the articles in *International Journal of Millimeter and Infrared Waves*, Vol. 12, p. 649, and *Applied Physics Letters*, Vol. 60, p. 3141 (both incorporated herein by reference), which disclose carrier heating by means of an electrical current and by means of radiation, respectively. These techniques can be adapted to lasers, and we contemplate embodiments of the invention which comprise one or the other of these means for carrier heating. Of course, other means for carrier heating will likely be discovered in the future, and the use of all such means is contemplated.

As is well known, the confinement factor $\Gamma$ depends on the refractive index of the cladding material that surrounds the core of the waveguiding region in the semiconductor laser. Variation of $\Gamma$ can advantageously be accomplished by varying the refractive index difference between the core and the cladding material. Such variation can be accomplished by a variety of known means, for example, electro-optically. See, for instance, I. P. Kaminow, "Introduction to Electro-Optic Devices", Academic Press, Orlando, 1974. Other ways of varying $\Gamma$ are likely to be discovered in the future, and the use of all ways of varying $\Gamma$ is contemplated.

It it also well known that $\tau_{ph}$ depends on the reflectivity of the "mirrors" that define the laser cavity. Variation of the reflectivity of distributed Bragg reflectors has recently been demonstrated (see O. Blum et al., *Applied Physics Letters*, Vol. 59, pp. 2971-2973, 1991), and embodiments of the invention (e.g., surface-emitting lasers) that comprise means for varying the reflectivity of one or both of the cavity-defining mirrors are contemplated.

Next we will discuss an exemplary embodiment of the invention which can result in a pure FM output regime. As indicated above, the resonant optical frequency $\Omega$ is one of the laser parameters that can be modulated by external means. For example, in a single-mode laser it is possible to electro-optically vary the index of refraction in a section of the laser cavity, resulting in a variation of the real part $\eta$ of the mode refractive index, so that $\Omega$ varies in accordance with the resonant-cavity condition $\Omega = \pi c/\eta L$, where L is the cavity length. (For simplicity, we have neglected the possible variation of $\Omega$ due to a varying phase of the mirror reflectivity.) The gain function g depends on the concentration n and temperature $T_e$ of carriers in the active region, as well as on the optical frequency $\Omega$—which in turn depends on the real part of the mode refractive index $\eta$ that also may be varied directly by some external influence X, viz. $\eta = \eta(X, n, T_e)$. Therefore, a variation $\hat{g}$ of g $[\Omega(X, n, T_e), n, T_e]$ now consists of three parts:

$$\hat{g} = g'_x\hat{X} + g'_n\hat{n} + g'_T\hat{T}_e, \quad (10)$$

where $$g'_x = \frac{\partial g}{\partial \Omega} \frac{\partial \Omega}{\partial X}, \quad g'_n = \frac{\partial g}{\partial \Omega} \frac{\partial \Omega}{\partial n} + \frac{\partial g}{\partial n}; \quad (11)$$

$$g'_T = \frac{\partial g}{\partial \Omega} \frac{\partial \Omega}{\partial T_e} + \frac{\partial g}{\partial T_e}.$$

In the instant exemplary embodiment, only two parameters are externally varied. These parameters are $T_e$ and X, where the latter exemplarily is a voltage V(t) that is applied to the electro-optic section of the laser resonant cavity, resulting in variation of $\Omega$. Other externally variable parameters are assumed constant, i.e., $$\hat{J} = \hat{\Gamma} = \tau_{ph} = 0. \quad (12)$$

Under these exemplary circumstances, imposition of the target relation
ti $\hat{g} = 0$, (13)

will result in a pure FM regime (characterized by $\hat{S}=0$), with the frequency $\Omega$ varying as $$\hat{\Omega} = -\frac{\partial g/\partial T_e}{\partial g/\partial \Omega} \hat{T}_e, \quad (14)$$

as those skilled in the art will be able to verify. Moreover, the fulfillment of the target condition (13) under conditions (12) will automatically ensure a constant carrier concentration in the active region, namely $\hat{n}=0$.

The variables $\hat{X}$ and $\hat{T}_e$ meet equation (13) if $g'_x X = -g'_T T_e$ or, equivalently, $$\hat{X} = -[(\partial g/\partial \hat{T}_e)T_e][(\partial g/\partial \Omega)(\partial \Omega/\partial X)]^{-1}. \quad (15)$$

Equation (15) is the coherence requirement between the dual modulations $\hat{X}$ and $\hat{T}_e$ to bring about the pure FM regime $\hat{S}=0$, provided the remaining variables are kept constant, as in Eq. (12).

The above analysis also has been provided for tutorial purposes, and is not intended to limit the invention.

Exemplarily, an optically pumped ($\hat{J}=0$) vertical cavity surface emitting laser (VCSEL) with one or more quantum wells in the active region, with $T_e$ controlled by $CO_2$ laser radiation, and with $\eta$ (and therefore $\Omega$) controlled by means of an applied voltage V(t), can be operated in the above discussed pure FM mode. As will be appreciated by those skilled in the art, the confinement factor $\Gamma$ typically does not vary in VCSELs, and $\tau_{ph}$ will be essentially constant in such a laser if, e.g., the mirrors are dielectric mirrors having high (typically $\gtrsim 99\%$) real reflectance R.

FIG. 1 schematically depicts an exemplary embodiment of the invention, an optical fiber communication system 10. Laser 11 emits radiation 14 in response to coherently varying inputs 190 and 191. The radiation is received by optical fiber 12, guided therethrough and detected by conventional detecting means 13, resulting in electrical output 15. Inputs 190 and 191 (exemplarily pump current and electron-heating radiation, respectively) are varied in response to a (typically electric) signal 16, with each of source means 17 and 18 (exemplarily current source and radiation source, respectively) comprising means (e.g., phase shift means and amplifier means) for providing coherence between 190 and 191.

Figure 2:
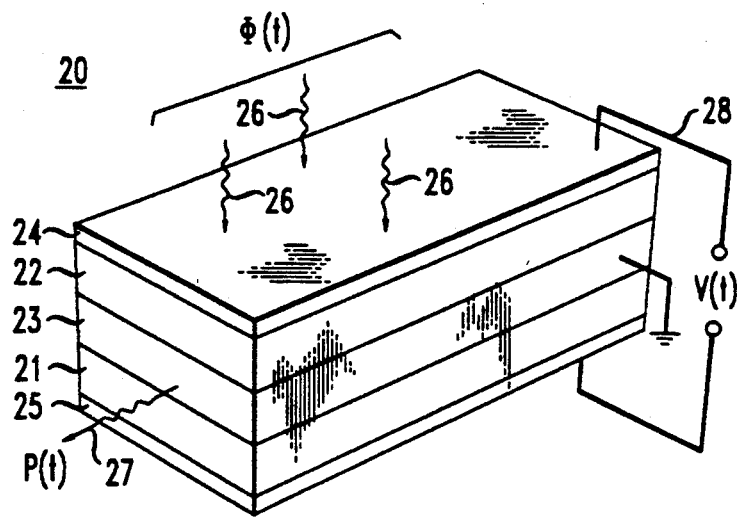
FIGS. 2-4 schematically show exemplary lasers according to the invention.

FIG. 2 schematically depicts a semiconductor laser 20 with means for externally varying the pumping rate and confinement factor. The laser comprises cladding regions 21 and 22 (at least one comprising electro-optic material, typically multilayered material), core region 23, and contact layers 24 and 25. Means 28 are provided for applying a time-varying voltage V(t) across the cladding structures. The core region, which comprises the active region of the laser (not separately shown), is electrically grounded. Pump radiation 26, of any wavelength capable of providing electron-hole pairs to the active region, is incident on the laser, resulting in emission of laser radiation 27 of power P(t). The pumping rate J(t) is proportional to the pump radiation intensity $\Phi(t)$, and V(t) causes variation in the refractive index of the cladding and therefore in the confinement factor $\Gamma(t)$. Coherently varying $\Phi(t)$ and V(t) can result in improved laser performance, e.g., in absence of frequency variations ("chirp"; i.e., $\hat{\Omega}=$ constant), or in suppression of the electron-photon resonance ($\hat{n}=0$).

Figure 3:
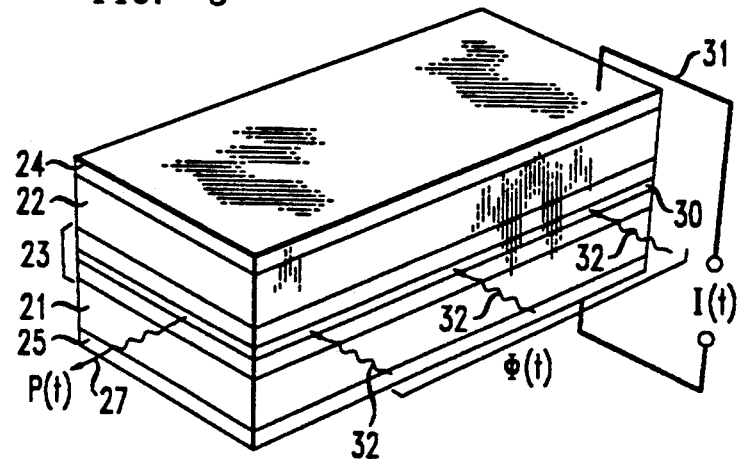

FIG. 3 schematically shows another semiconductor laser. Core region 23 comprises a quantum well 30, the active region of the laser. Means 31 facilitate application of pump current I(t) to the laser structure. Radiation 32, of wavelength adapted for exciting carriers from a lower to a higher energy level in the quantum well (i.e., adapted for carrier heating), is incident on the quantum well. Variation of the intensity $\Phi(t)$ of radiation 32 results in variation of $T_e(t)$. Coherently varying the pump current I(t) and the intensity of radiation 32 can result in improved device performance, as discussed above.

Figure 4:
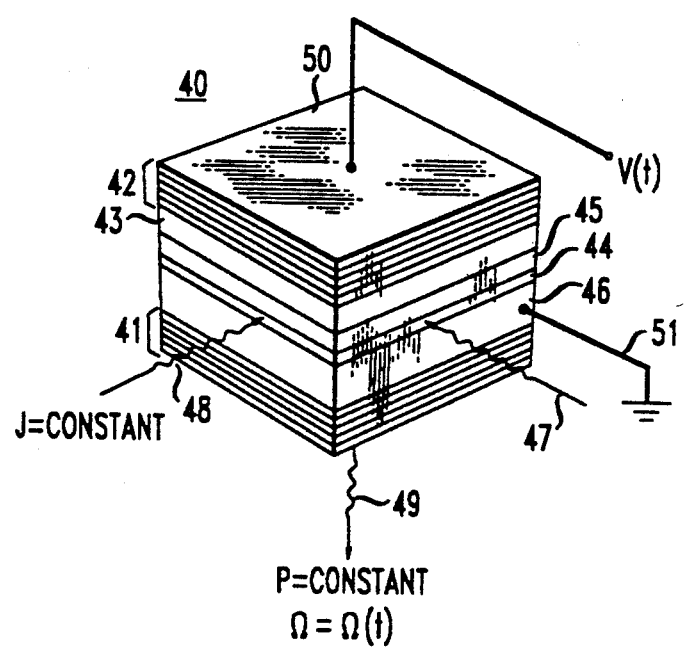

Although FIGS. 2 and 3 schematically depict longitudinal cavity lasers, the invention is not so limited. Indeed, in many cases, it will be advantageous to practice the invention with a vertical cavity surface emitting laser (VCSEL), and FIG. 4 schematically shows a VCSEL 40 with dual parameter variation. The laser comprises quantum well region 44 between cladding regions 45 and 46. Region 43 comprises an electro-optic medium (e.g., comprising quantum wells) whose refractive index is a function of the electric field, controlled by the voltage V(t) applied between contact layer 50 and grounding means 51. Regions 41 and 42 are multilayer high reflectivity dielectric mirrors. Numeral 48 refers to constant amplitude pump radiation, 47 to carrier heating radiation, exemplarily $CO_2$ laser radiation, and 49 to the laser output. If V(t) and radiation 47 are appropriately chosen, FM laser output 49 has constant amplitude.

We claim:

1. Method of operating an article that comprises a semiconductor laser having a radiation output, and that further comprises means for utilizing the radiation output, associated with the laser at least during laser operation being a pumping rate J, an optical gain coefficient g, a photon lifetime $\tau_{ph}$, a confinement factor $\Gamma$, a spontaneous emission factor $\Gamma$, a carrier density n, an effective carrier temperature $T_e$, an output power P, and an output frequency $\Omega$; the method comprising pumping the laser such that the laser operates in the lasing regime; CHARACTERIZED IN THAT the method further comprises modulating the radiation output by coherently varying at least two of parameters J, g, $\Gamma$, $\tau_{ph}$, $T_e$, $\Omega$ and $\beta$.

2. Method of claim 1, comprising coherently varying J and g.

3. Method of claim 1, comprising coherently varying J and $\Gamma$.

4. Method of claim 1, comprising coherently varying J and $\tau_{ph}$.

5. Method of claim 1, wherein said at least two parameters are coherently varied such that the carrier density n is essentially constant.

6. Method of claim 5, wherein said at least two parameters are coherently varied at a frequency above 10 GHz.

7. Method of claim 1, wherein said at least two parameters are coherently varied such that the output power P is modulated and the output frequency $\Omega$ is essentially constant.

8. Method of claim 7, wherein said at least two parameters are coherently varied at a frequency above 1 GHz.

9. Method of claim 1, comprising coherently varying $\Omega$ and $T_e$.

10. Method of claim 1, wherein said at least two parameters are varied such that the output frequency $\Omega$ is modulated and the output power P is essentially constant.

11. Method of claim 1, wherein the device is optically pumped.

12. Method of claim 1, wherein the device is electrically pumped.

13. An article that comprises a semiconductor laser having a radiation output, associated with the laser at least during laser operation being a pumping rate J, an optical gain coefficient g, a photon lifetime $\tau_{ph}$, a confinement factor $\Gamma$, a spontaneous emission factor $\beta$, a carrier density n, an effective carrier temperature $T_e$, an output power P and an output frequency $\Omega$; CHARACTERIZED IN THAT the article comprises means for coherently varying at least two of parameters J, g, $\Gamma$, $\tau_{ph}$, $T_e$, $\Omega$ and $\beta$.

14. Article according to claim 13, further comprising means for utilizing the radiation output of the laser.

* * * * *

UNITED STATES PATENT AND TRADEMARK OFFICE
CERTIFICATE OF CORRECTION

PATENT NO. : 5,311,526
DATED : May 10, 1994
INVENTOR(S) : Vera B. Gorfinkel and Serge Luryi It is certified that error appears in the above-indentified patent and that said Letters Patent is hereby corrected as shown below:

Column 10, line 57, "I" should read -- $\beta$ --.

Signed and Sealed this

Thirtieth Day of August, 1994

Attest:

BRUCE LEHMAN

*Attesting Officer*     *Commissioner of Patents and Trademarks*